(12) United States Patent
Chen et al.

(10) Patent No.: US 11,610,633 B2
(45) Date of Patent: Mar. 21, 2023

(54) LOW-LEAKAGE DRAIN-PROGRAMMED ROM

(71) Applicant: QUALCOMM Incorporated, San Diego, CA (US)

(72) Inventors: Xiao Chen, San Diego, CA (US);
Chen-ju Hsieh, Campbell, CA (US);
Sung Son, San Jose, CA (US);
Chulmin Jung, San Diego, CA (US)

(73) Assignee: QUALCOMM, INCORPORATED, San Diego, CA (US)

( * ) Notice: Subject to any disclaimer, the term of this patent is extended or adjusted under 35 U.S.C. 154(b) by 84 days.

(21) Appl. No.: 17/367,248

(22) Filed: Jul. 2, 2021

(65) Prior Publication Data
US 2023/0005546 A1    Jan. 5, 2023

(51) Int. Cl.
| G11C 16/00 | (2006.01) |
| G11C 16/10 | (2006.01) |
| G11C 16/26 | (2006.01) |
| G11C 17/12 | (2006.01) |
| G11C 16/08 | (2006.01) |
| G11C 16/04 | (2006.01) |
| G11C 16/24 | (2006.01) |

(52) U.S. Cl.
CPC ........ G11C 16/102 (2013.01); G11C 16/0433 (2013.01); G11C 16/08 (2013.01); G11C 16/24 (2013.01); G11C 16/26 (2013.01); G11C 17/126 (2013.01)

(58) Field of Classification Search
CPC ......... G11C 11/419; G11C 7/12; G11C 7/065; G11C 11/4094; G11C 16/04; G11C 2029/5006; G11C 29/50; G11C 7/1048; G11C 7/18; G11C 11/22; G11C 11/4097; G11C 11/4099; G11C 5/063; G11C 7/14; G11C 16/28; G11C 7/062; G06F 30/36; G06F 30/398; H01L 27/105; H01L 27/1052; H01L 27/11; H01L 27/1116
USPC ........ 365/189.11, 189.15, 203, 63, 154, 191, 365/205, 185.05, 185.21, 185.25, 185.26, 365/189.03, 189.09, 189.18, 196, 201, 365/207, 210.1, 210.12, 210.13
See application file for complete search history.

(56) References Cited

U.S. PATENT DOCUMENTS

| 6,952,376 B2 * | 10/2005 | Somasekhar ............ G11C 7/14 365/207 |
| 9,691,496 B1 | 6/2017 | Kohli et al. |
| 2005/0254280 A1 | 11/2005 | Yamauchi |
| 2007/0127302 A1 | 6/2007 | Okamoto et al. |
| 2011/0273919 A1 | 11/2011 | Buer et al. |

(Continued)

OTHER PUBLICATIONS

International Search Report and Written Opinion—PCT/US2022/034117—ISA/EPO—dated Sep. 23, 2022.

*Primary Examiner* — Thong Q Le
(74) *Attorney, Agent, or Firm* — Haynes and Boone, LLP (57) ABSTRACT

A drain programmed read-only memory includes a diffusion region that spans a width of a bitcell and forms a drain of a first transistor and a second transistor. A bit line lead in a metal layer adjacent the diffusion region extends across the width of the bitcell. A first via extends from an upper half of the bit line lead and couples to a drain of the first transistor. Similarly, a second via extends from a lower half of the bit line and couples to a drain of the second transistor.

24 Claims, 8 Drawing Sheets

(56) References Cited

U.S. PATENT DOCUMENTS

2017/0025185 A1 1/2017 Rawat et al.
2019/0221239 A1 7/2019 Thapliyal et al.

* cited by examiner

FIG. 7 asserting a voltage of a first word line coupled to a gate of a first transistor arranged in a row within a bitcell height with a second transistor to cause the first transistor to conduct charge from a first drain via positioned on an upper half of a bit line lead to ground through a first ground via positioned on a first ground lead having a central longitudinal axis substantially aligned with an upper boundary of the bitcell height ─800 asserting a voltage of a second word line coupled to a gate of the second transistor to cause the second transistor to conduct charge from a second drain via positioned on a lower half of the bit line lead to ground through a second ground via positioned on a second ground lead having a central longitudinal axis substantially aligned with an lower boundary of the bitcell height ─ 805

FIG. 8

LOW-LEAKAGE DRAIN-PROGRAMMED ROM

TECHNICAL FIELD

This application relates to memories, and more particularly to a read-only memory (ROM) with drain programming and low leakage.

BACKGROUND

One form of a mask-programmable read-only memory (ROM) involves the programming of a source connection for a metal-oxide-semiconductor field-effect transistor (MOSFET) such as an n-type-metal-oxide-semiconductor (NMOS) transistor. The density of such a ROM is advantageously high as each stored bit uses just one NMOS transistor. But leakage may undesirably increase power consumption in a source-programmed ROM. To reduce sub-threshold leakage, a source-programmed ROM may use thick-gate-oxide (high threshold voltage (VT)) transistors. Although sub-threshold leakage is reduced, high-VT devices in a source-programmed ROM may still suffer gate-induced drain leakage (GIDL).

SUMMARY

A read-only memory is provided that includes: a semiconductor substrate including a diffusion region configured to form a drain of a first transistor and a drain of a second transistor; a metal layer adjacent the diffusion region, the metal layer being configured to include a bit line lead that extends across the diffusion region; a first drain via positioned within an upper half of the bit line lead, the first drain via being configured to couple from the upper half of the bit line lead to the drain of the first transistor; and a second drain via positioned within a lower half of the bit line lead, the second drain via being configured to couple from the lower half of the bit line lead to the drain of the second transistor.

In addition, a read-only memory is provided that includes: a plurality of bitcells arranged into a row within a bitcell height, each bitcell in the plurality of bitcells including a first transistor and a second transistor; a diffusion region configured to extend across the row, the diffusion region being configured for each bitcell in the plurality of bitcells to form a drain of the bitcell's first transistor and to form a drain of the bitcell's second transistor; and a metal layer adjacent the diffusion region, the metal layer being configured to include a bit line lead that extends across the row; wherein each bitcell in a first subset of the plurality of bitcells is configured to include a first drain via positioned on and coupled from a lower half of the bit line lead to the drain of the bitcell's first transistor and to include a second drain via positioned on and coupled from an upper half of the bit line lead to the drain of the bitcell's second transistor and, and wherein each bitcell in a second subset of the plurality of bitcells is configured to electrically isolate both the drain of the bitcell's first transistor and the drain of the bitcell's from the bit line lead.

Moreover, a method of operating a read-only memory is provided that includes: asserting a voltage of a first word line coupled to a gate of a first transistor arranged in a row within a bitcell height with a second transistor to cause the first transistor to conduct charge from a first drain via positioned on an upper half of a bit line lead to ground through a first ground via positioned on a first ground lead having a central longitudinal axis substantially aligned with an upper boundary of the bitcell height; and asserting a voltage of a second word line coupled to a gate of the second transistor to cause the second transistor to conduct charge from a second drain via positioned on a lower half of the bit line lead to ground through a second ground via positioned on a second ground lead having a central longitudinal axis substantially aligned with a lower boundary of the bitcell height.

Finally, a read-only memory is provided that includes: a diffusion region configured to extend from a first side of a bitcell to a second side of the bitcell; a first dummy gate aligned with the first side of the bitcell; a second dummy gate aligned with the second side of the bitcell; a gate of a first transistor adjacent the first dummy gate and configured to extend from a lower boundary of the bitcell and across the diffusion region to an upper boundary of the bitcell; a gate of a second transistor arranged between the gate of the first transistor and the second dummy gate, wherein the diffusion region is further configured to form a drain of the first transistor positioned between the first dummy gate and the gate of the first transistor, a shared source of the first transistor and the second transistor positioned between the gate of the first transistor and the gate of the second transistor, and a drain of the second transistor positioned between the gate of the second transistor and the second dummy gate; a metal layer adjacent the diffusion region, the metal layer being configured to form a bit line lead having a height, the metal layer being further configured to form a first ground lead having a central longitudinal axis substantially aligned with the upper boundary of the height of the bitcell; and a first via positioned on a first half of the height of the bit line lead and coupled to the drain of the first transistor, wherein a drain of the second transistor is isolated from bit line lead.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figure.

DETAILED DESCRIPTION

A mask-programmed ROM is very compact and thus relatively-low cost as compared to other types of memories.

By adjusting the photolithography during the manufacture of a mask-programmed ROM, a designer may encode the mask-programmed ROM with the desired data. As semiconductor manufacturing technology has progressed from one technology node to another to produce ever-more miniaturized devices, the layout requirements of a mask-programmed ROM has led to the use of a source-programmed implementation as will be explained further herein.

In a source-programmed ROM, each bit is written to the source-programmed ROM by the source programming of a corresponding transistor. In an n-type metal-oxide-semiconductor (NMOS) source-programmed ROM, the source programming for each transistor determines whether the transistor has a source coupled to ground. In general, one binary state for a stored bit may be represented by programing a transistor to have its source coupled to ground. Conversely, a complementary binary state for a stored bit may be represented by programming a transistor to have its source electrically isolated from ground.

Figure 1:
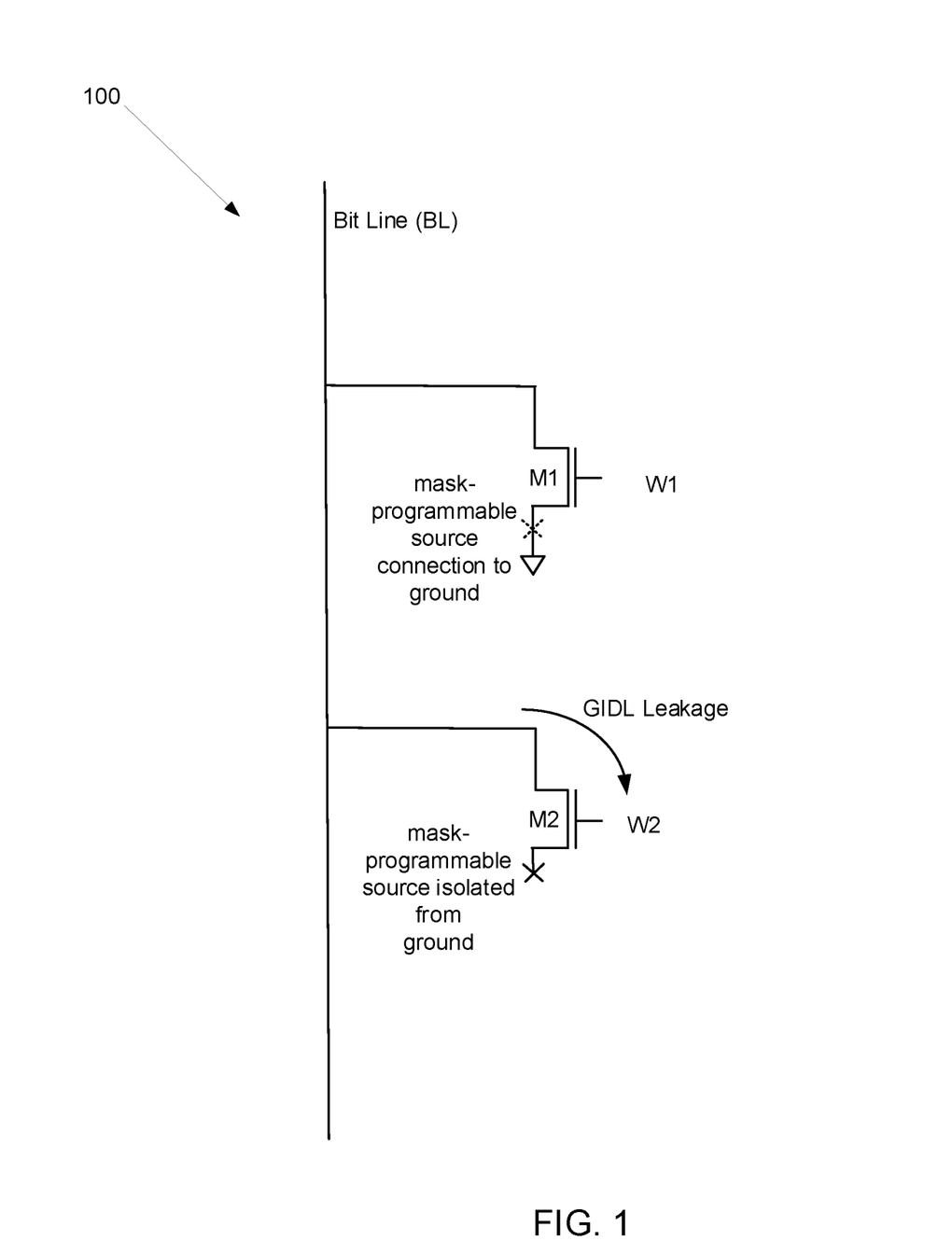
FIG. 1 is a circuit diagram of a conventional source-programmed ROM.

To provide a better understanding of why modern mask-programmed ROMs are source-programmed, a typical source-programmed NMOS ROM 100 will be discussed as shown in FIG. 1. ROM 100 includes an NMOS transistor M1 and an NMOS transistor M2 that are each included within the height and width of a bitcell. In that regard, the term bitcell as used herein refers to the semiconductor area for a pair of neighboring transistors and the associated dummy gates. A bitcell as that term is used herein thus stores two bits. Since the storage of each bit requires only one transistor, ROM 100 has an advantageously-high density as compared to memories that require more than one transistor per stored bit. The drain of each transistor M1 and M2 couples to a bit line (BL). The source programming determines whether transistors M1 and M2 each has a source coupled to ground. In the following discussion, it will be assumed that a transistor with a source coupled to ground represents a binary zero. Conversely, a transistor with a source isolated from ground represents a binary one. However, the binary convention may be reversed in other implementations. During a read operation for ROM 100, bit line BL is first pre-charged through a coupling to a power supply node (not illustrated) for a power supply voltage VDD. Bit line BL is then isolated from the power supply node so that the pre-charged bit line BL floats prior to the read operation.

To read the binary content stored by transistor M1, a word line W1 that couples to a gate of transistor M1 is asserted to the power supply voltage VDD. Since transistor M1 has a source connection to ground, the assertion of the gate voltage for transistor M1 discharges the pre-charged bit line to ground so that a sense amplifier (e.g., an inverter) may sense the binary zero encoded by the source programming of transistor M1. Similarly, a word line W2 is asserted to the power supply voltage VDD during a read operation to transistor M2.

Figure 2:
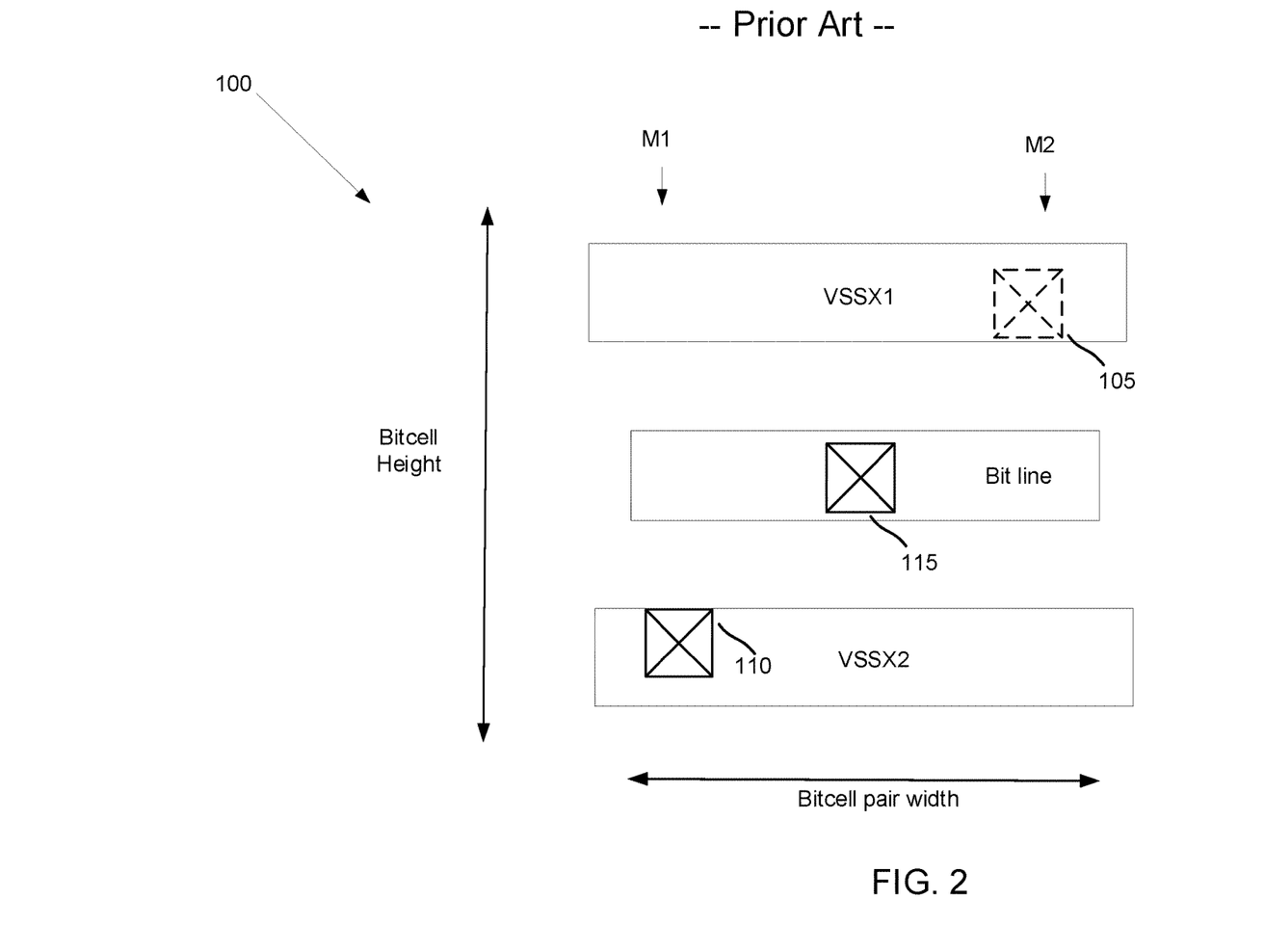
FIG. 2 illustrates a metal-layer layout for a pair of transistors in the source-programmed ROM of FIG. 1.

ROM 100 is integrated into an active surface of a semiconductor die as known in the integrated circuit arts. Signals, power, and ground for the ROM are carried in leads formed in metal layers adjacent the active surface. A ROM integrated circuit will include a plurality of metal layers, ranging from a first metal layer that is closest to the active surface of the semiconductor die to a final metal layer that is furthest from the active surface. A layout for the first metal layer is shown in FIG. 2. Transistors M1 and M2 are adjacent to each other. Each transistor fits within a common bitcell height. During the integrated circuit manufacturing process, the first metal layer is patterned into a bit line lead to form the bit line and also into two tracks or leads for ground. A ground lead VSSX2 near the bottom of the bitcell height is the ground for transistor M1 depending upon the source programming. Similarly, a ground lead VSSX1 near the top of the bitcell height is the ground for transistor M2 depending upon the source programming. Since transistor M1 is source programmed to store a binary zero, a via 110 couples from VSSX2 to the source of transistor M1. Should transistor M2 be similarly source programmed to couple its source to ground, a via 105 couples from ground VSSX1 to the source of transistor M2. In this example, it is assumed that transistor M2 is programmed to store a binary one so that via 105 would not be present for such a programming. Both transistors M1 and M2 have a shared drain couple to the bit line through a via 115. Note the challenge in the metal layer layout for ROM 100. Each transistor M1 and M2 must fit within a relatively short bitcell height and requires its own ground. These design constraints have generally forced designers into a source programming implementation as opposed to a drain programming implementation in which the transistor drains are selectively coupled (or not coupled) to the bit line.

Figure 3:
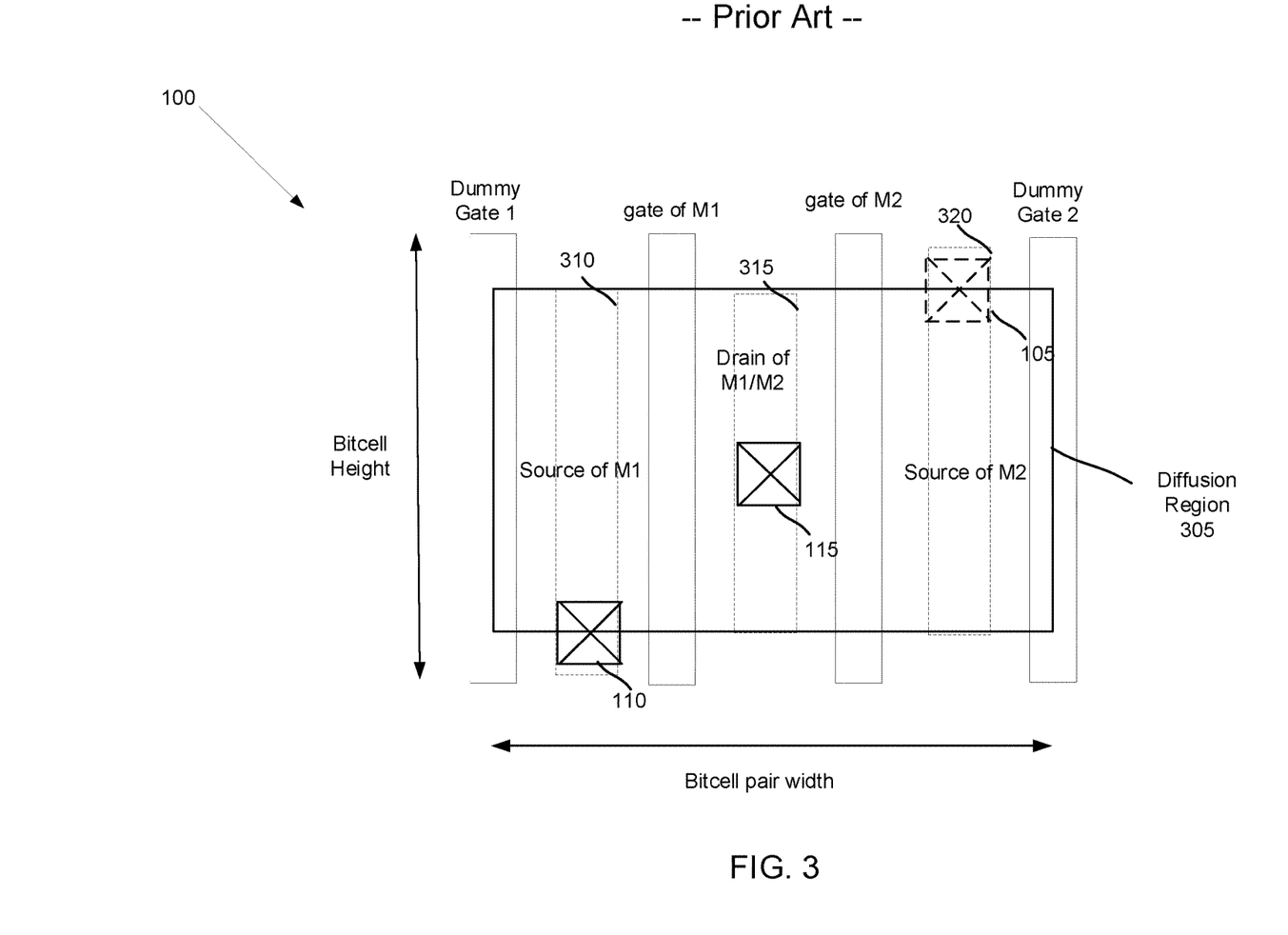
FIG. 3 illustrates a device-layer layout for the pair of transistors in the source-programmed ROM of FIGS. 1 and 2.

The device layer (active semiconductor surface) layout for ROM 100 is shown in FIG. 3. An n-doped diffusion region 305 forms from left to right the source of transistor M1, a shared drain of transistors M1 and M2, and the source of transistor M2. Diffusion region 305 is shown extending across only the bitcell width but it will be appreciated that diffusion region 305 may extend to additional bitcells. Transistor M1 is isolated from any neighboring bitcell (not illustrated) by a first dummy gate 1 that traverses diffusion region 305. A gate of transistor M1 and a gate of transistor M2 also traverse diffusion region 305. A second dummy gate 2 isolates the source of transistor M2 from any neighboring bitcell (not illustrated) in the same bitcell height. The source via 110 (when present) for transistor M1 couples to a column 310 of local interconnect that extends across the source of transistor M1. As known in the local interconnect arts, column 310 may be formed from a deposition of a metal such as copper. Via 115 couples to the shared drain of transistors M1 and M2 through a similar column 315 of local interconnect. Finally, via 105 (when present) couples to the source of transistor M2 through another column 320 of local interconnect.

Although this source programming is driven by the layout needs of fitting the pair of transistors within such a relatively-short bitcell height, leakage remains a problem. Referring again to FIG. 1, a transistor such as M1 that has its source coupled to ground may conduct a sub-threshold leakage current to ground when the bit line is charged despite the word line W1 being discharged. This sub-threshold leakage may be mitigated or reduced by constructing transistors M1 and M2 to be thick-gate-oxide devices. The resulting high threshold voltage (high-VT) for the bitcell transistors may significantly reduce sub-threshold leakage currents for those transistors having their sources coupled to ground. But gate-induced drain leakage (GIDL) may still flow from the drain of transistors to their word lines even though their sources are disconnected from ground as shown for transistor M2. The GIDL currents undesirably may dominate the leakage budget of a ROM despite the use of high-VT transistors.

Figure 4:
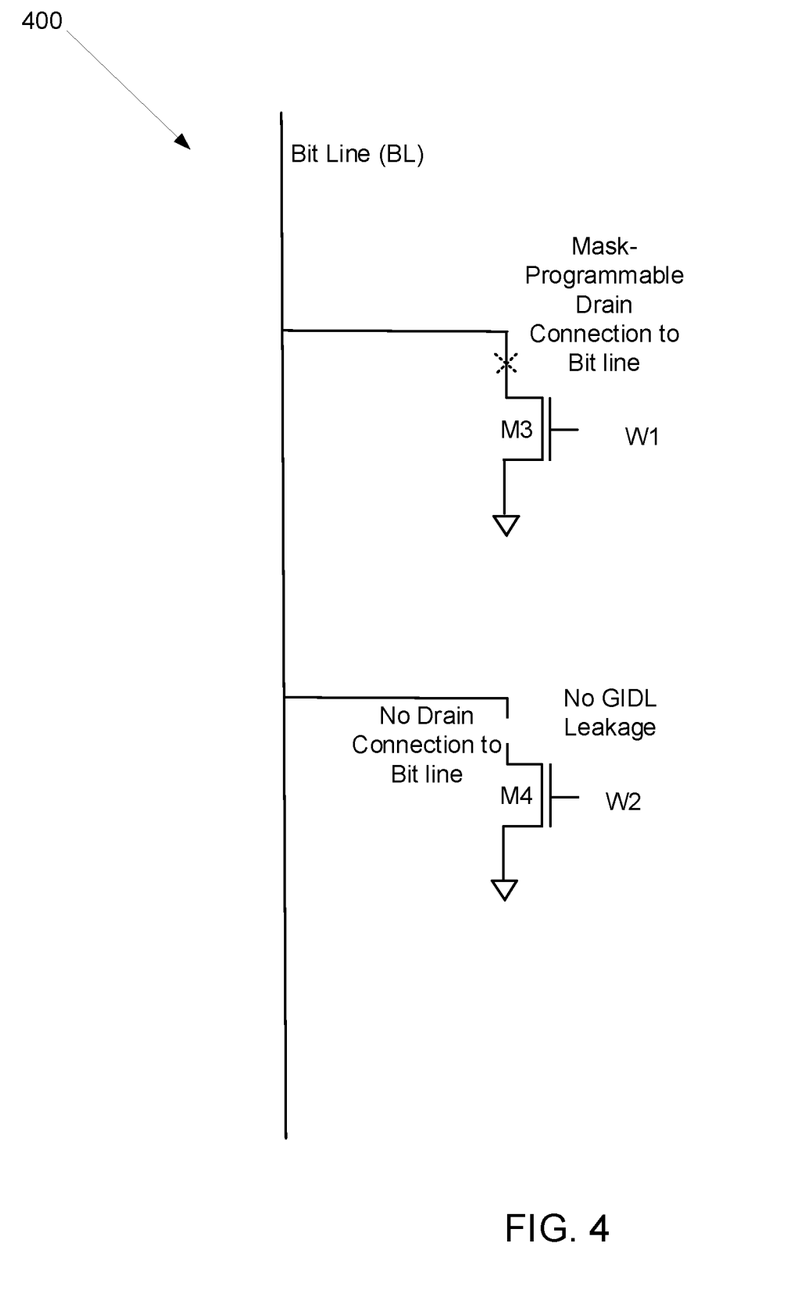
FIG. 4 is a circuit diagram of a drain-programmed ROM in accordance with an aspect of the disclosure.

A drain-programmed ROM bitcell is disclosed that advantageously fits within the constrained bitcell height of modern process nodes and eliminates or reduces GIDL currents. Sub-threshold leakage is also reduced through the use of high-VT transistors. An example drain-programmed ROM 400 is shown in FIG. 4 that includes two high-VT NMOS transistors M3 and M4. Each transistor M3 and M4 may or may not have its drain coupled to a bit line (BL) depending upon its drain programming. The source of each transistor M3 and M4 is coupled to ground. In ROM 400, transistor M3 is drain programmed to couple to the bit line whereas transistor M4 has its drain electrically isolated from the bit line (there being no via to couple the isolated drain to the bit line). A word line W1 couples to the gate of transistor M3 whereas a word line W2 couples to the gate of transistor M4.

A read operation occurs analogously as discussed for ROM 100. The bit line is pre-charged to the power supply voltage VDD and then floats while the appropriate word line is asserted. For transistor M3, the assertion of word line W1 during a read operation causes transistor M3 to switch on and discharge the bit line towards ground. A sense amplifier (not illustrated) such as an inverter may then sense the discharging of the bit line to make a bit decision and read the stored binary content of transistor M3. In one implementation, the drain programming of transistor M3 to couple to the bit line may be deemed to represent a binary zero although this convention may be reversed in alternative implementations. Conversely, the drain programming of transistor M4 that isolates the drain of transistor M4 from the bit line may be deemed to represent a stored binary one. During a read operation in which the word line W2 voltage is asserted to the power supply voltage VDD, the bit line remains pre-charged since the drain of transistor M4 is isolated from the bit line. A sense amplifier may then sense this binary one value stored in transistor M4 by sensing that the bit line remained pre-charged during the read operation. As discussed with transistor M3, the binary convention of whether transistor M4 stores a binary one may be reversed in alternative implementations such that a drain isolated from ground would instead represent a binary zero.

Figure 5:
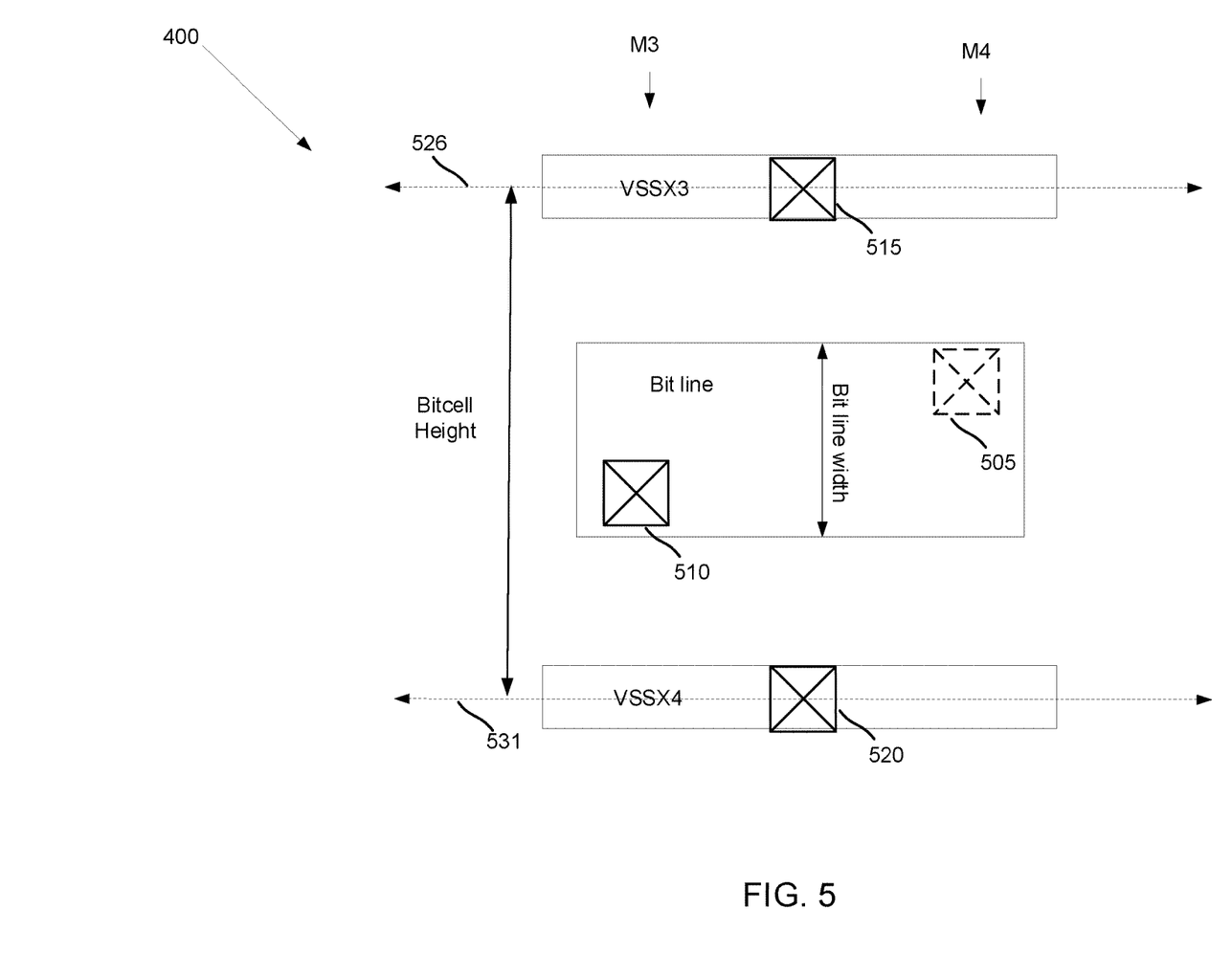
FIG. 5 illustrates a metal-layer layout for the pair of transistors in the drain-programmed ROM of FIG. 4 in accordance with an aspect of the disclosure.

As discussed previously for the source-programmed ROM 100, each bitcell for ROM 400 should fit within the bitcell height for a particular process node. As the bitcell height has become smaller and smaller, mask-programmed ROMs were forced to be source-programmed ROMs to satisfy the necessary bitcell height. Note that it would be very expensive for a process node to vary from the required bitcell height as the semiconductor manufacturing for that process node has been designed around implementing such a bitcell height. A first metal layer (M1) layout for ROM 400 that advantageously satisfies the desired bitcell height is shown in FIG. 5.

A bit line is shown extending only across the bitcell width for illustration purposes. However, the bit line lead may extend to bitcells (not illustrated) to the left of transistor M3 and to bitcells (not illustrated) to the right of transistor M4. These additional bitcells also fit within the bitcell height for transistors M3 and M4. A drain via 510 couples from the bit line lead to a drain of transistor M3. If transistor M3 is programmed to be isolated from the bit line, drain via 510 would be absent. Similarly, a drain via 505 couples form the bit line to a drain of transistor M4. Since transistor M4 is assumed to be drain programmed so as to be isolated from the bit line, drain via 505 is absent and thus denoted by a dotted line. To permit both transistors to have drain programming, the bit line metal lead has a width (which may also be denoted as a height) that may be more than twice the height of each of vias 510 and 505. Note that the via height is set by the process node and would be the same as in source-programmed ROM 100 for the same process node. Referring again to FIG. 2, the bit line for source-programmed ROM 100 has a width that is approximately the same height as via 115. But such a bit line width would result in a manufacturing conflict for drain vias 510 and 505 in drain-programmed ROM 400. But increasing the bit line width would be untenable for source-programmed ROM 100 as there must be a minimum spacing between the bit line and the source leads VSSX1 and VSSX2.

Referring again to FIG. 5, a ground lead VSSX3 is shared with a bitcell (not illustrated) above the bitcell height for transistors M3 and M4. A ground via 515 couples from ground lead VSSX3 to a shared source region (not shown in FIG. 5 but discussed further below) for transistors M3 and M4. Since ground lead VSSX3 is shared with the bitcells above, only a bottom half of ground lead VSSX3 is within the bitcell height for transistors M3 and M4. A central longitudinal axis 526 of ground lead VSSX3 is thus aligned with an upper boundary of the bitcell height for transistors M3 and M4. Similarly, a ground lead VSSX4 is shared with a bitcell pair (not illustrated) below the bitcell height for transistors M3 and M4. A ground via 520 couples from ground lead VSSX4 to the shared source region for transistors M3 and M4. Since ground lead VSSX4 is shared with the bitcell pair below, only the top half of ground lead VSSX4 is within the bitcell height for transistors M3 and M4. The bottom half is within the bitcell height for the neighboring bitcells. A central longitudinal axis 531 of ground lead VSSX4 is thus aligned with the lower boundary of the bitcell height. Longitudinal axes 526 and 531 as well as a central longitudinal axis (not illustrated) of the bit line may all be in parallel with each other. The sharing of the ground leads VSSX3 and VSSX4 between the bitcells is advantageous as it allows the bit line lead to be widened (increased in height) to accept both drain vias 505 and 510. Drain via 505 (if present) may thus be positioned in an upper half of the bit line lead whereas drain via 510 is positioned in a lower half of the bit line lead. In this fashion, ROM 400 may be drain programmed with high-VT transistors and thus mitigate both sub-threshold and GIDL leakage. GIDL leakage is reduced since the charged bit line is isolated from the drain of transistors such as transistor M4 that are drain programmed to be isolated from the bit line.

Figure 6:
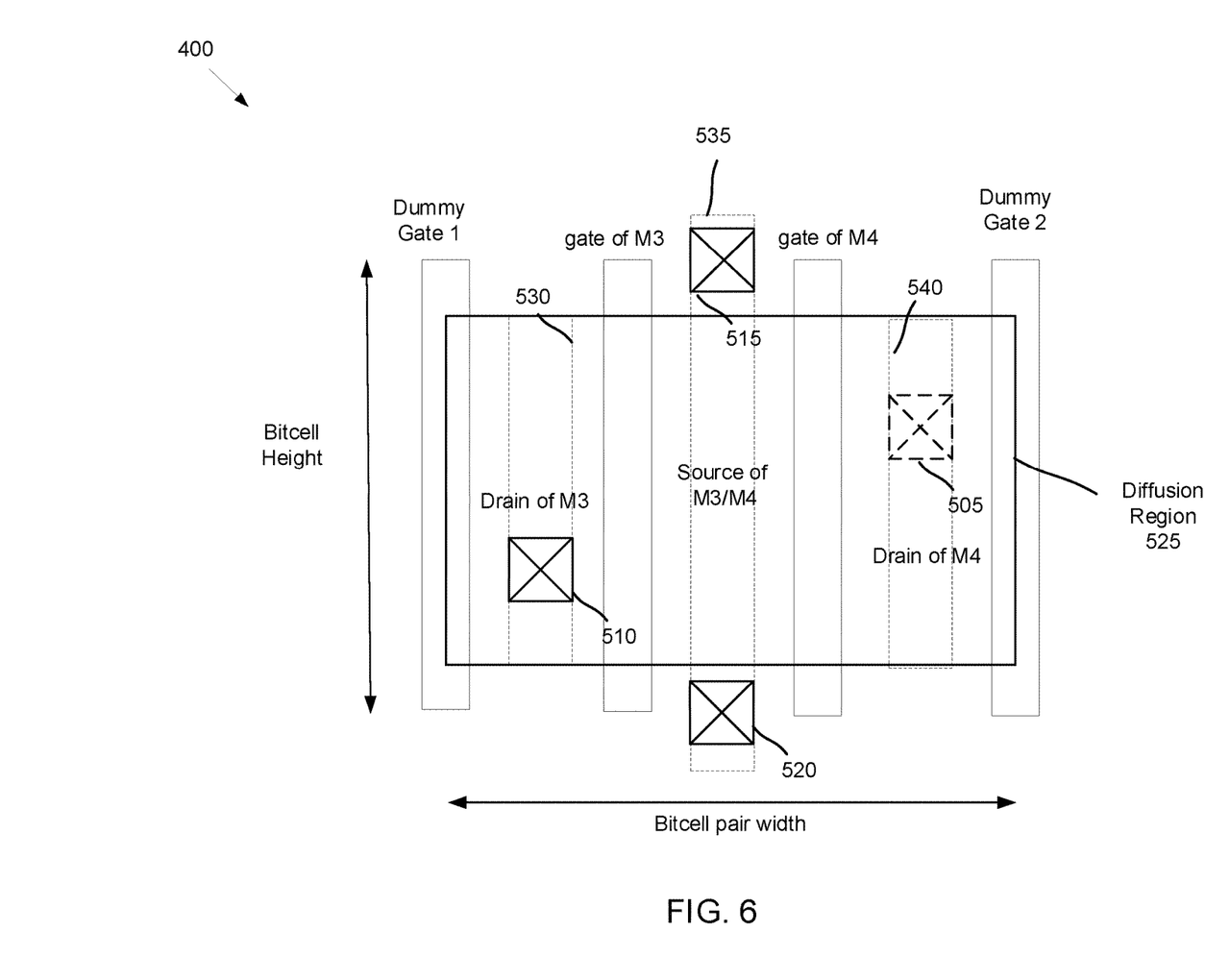
FIG. 6 illustrates a device-layer layout for the pair of transistors in the drain-programmed ROM of FIG. 4 in accordance with an aspect of the disclosure.

A device layer (active semiconductor surface layer) layout for ROM 400 is shown in FIG. 6. A diffusion region 525 on a semiconductor die may have the same dimensions as discussed for ROM 100 because the bitcell width and height is unchanged. The doping of diffusion region 525 depends upon the transistor polarity. In an NMOS implementation, diffusion region 525 is doped n-type but would instead be doped p-type in a p-type metal-oxide-semiconductor (PMOS) implementation. Dummy gate 1, the gate of transistor M3, the gate of transistor M4, and dummy gate 2 are arranged as discussed for ROM 100. Drain via 510 (should it be present) couples to the drain of transistor M3 through a column 530 of local interconnect that extends across diffusion region 525. Ground vias 515 and 520 couple to the shared source region of transistors M3 and M4 through a column 535 of local interconnect. Drain via 505 (should it be present) couples to the drain of transistor M4 through a column 540 of local interconnect. Columns 530, 535, and 540 are arranged orthogonally to diffusion region and are thus arranged in parallel with the dummy gate and gate regions.

Figure 7:
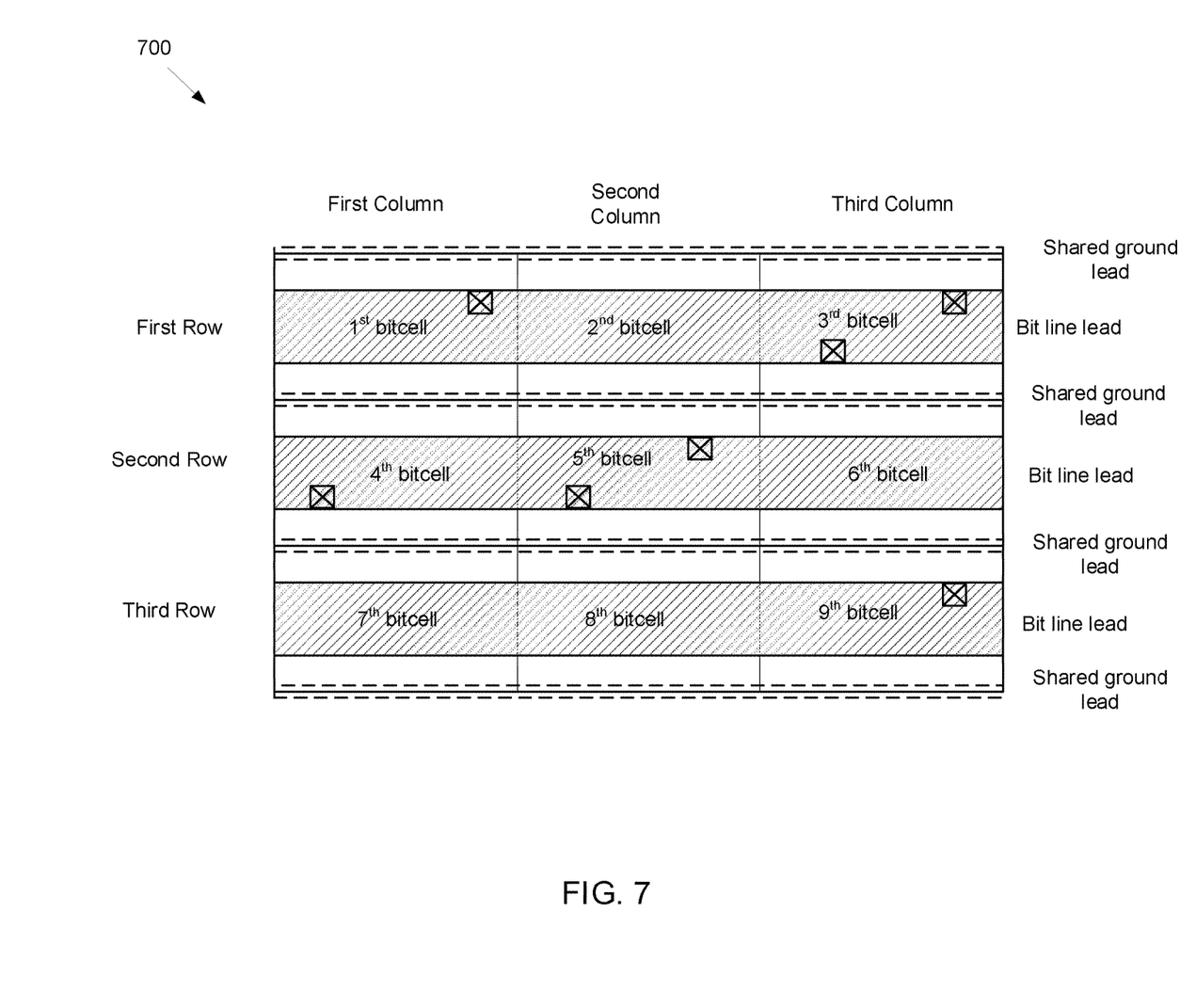
FIG. 7 illustrates an array of drain-programmed bitcells for a ROM in accordance with an aspect of the disclosure.

A plurality of bitcells may be arranged into rows and columns to form a memory array 700 as shown in FIG. 7. Each bitcell may be implemented as discussed for FIGS. 5 and 6. For illustration purposes, array 700 is shown including 3 rows and 3 columns of bitcells but it will be appreciated that the number of rows and columns may be much larger (or smaller) in alternative ROM implementations. The first row of bitcells begins with a first bitcell in which only the second transistor has a drain via to the first row's bit line lead. A ninth bitcell in the third row has the same drain programming. A second bitcell in the first row, a sixth bitcell in the second row, a seventh bitcell in the third row, and an eighth bitcell in the third row are all programmed to have no drain vias for their first and second transistors coupling to the bit line lead. The drains for the first and second transistors in these bitcells are thus electrically isolated from their respective bit line leads. A third bitcell in the first row and a fifth bitcell in the second row are both programmed to have the drains of their first and second transistors coupled to their respective bit line leads through corresponding drain vias. The upper (or lower) boundary for each bitcell is aligned with the central longitudinal axis of the corresponding ground lead.

Figure 8:
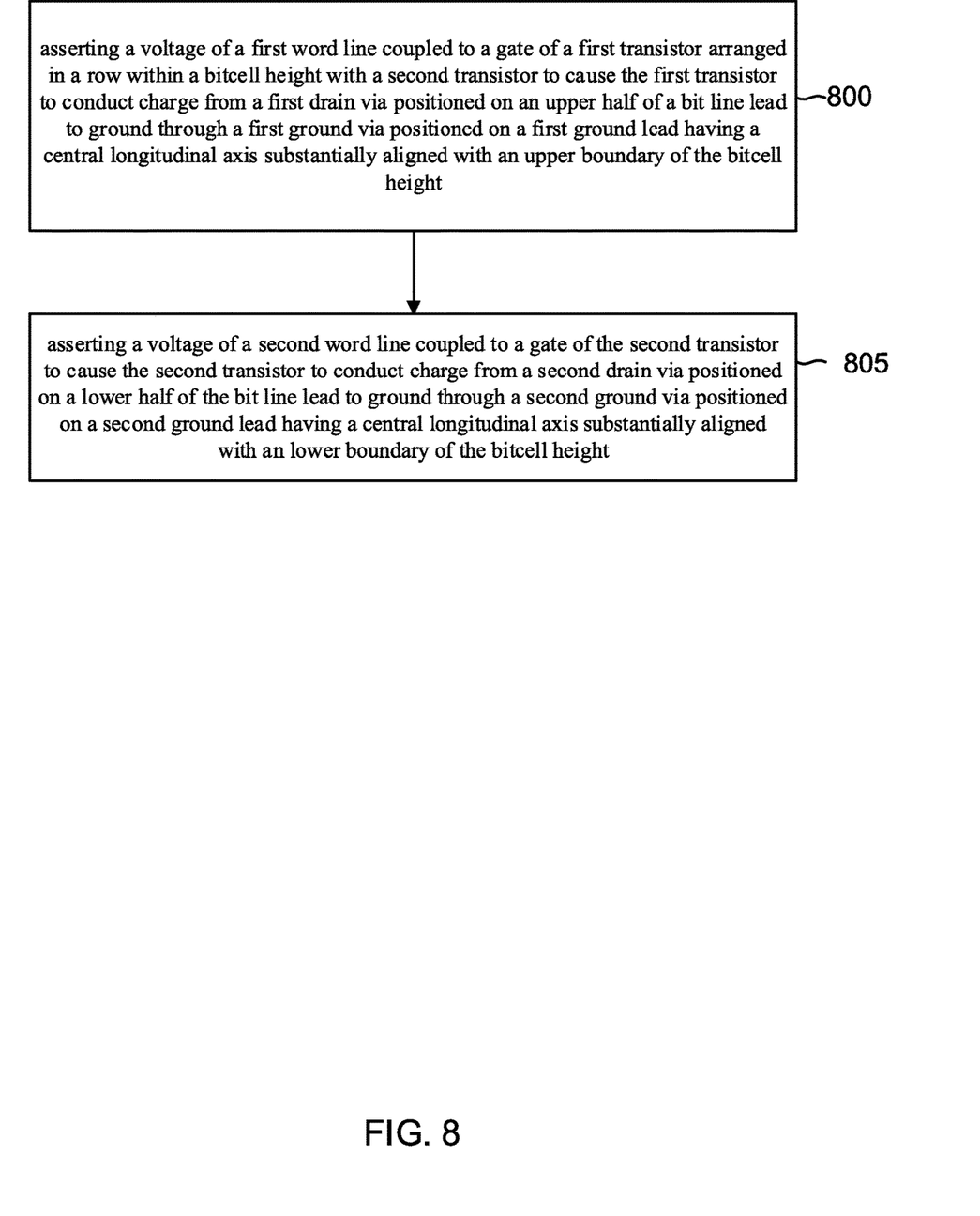
FIG. 8 is a flowchart for a method of operation of a drain-programmed ROM in accordance with an aspect of the disclosure.

A method of operating a ROM in accordance with the disclosure will now be discussed with reference to the flowchart of FIG. 8. The method includes an act 800 of asserting a voltage of a first word line coupled to a gate of a first transistor arranged in a row within a bitcell height with a second transistor to cause the first transistor to conduct charge from a first drain via positioned on an upper half of a bit line lead to ground through a first ground via positioned on a first ground lead having a central longitudinal axis substantially aligned with an upper boundary of the bitcell height. An example word line is word line W1 of FIG. 4. Causing transistor M4 of FIG. 6 to conduct through drain via 505 to discharge into ground through ground via 515 is an example of act 800. In addition, the method includes an act 805 of asserting a voltage of a second word line coupled to a gate of the second transistor to cause the second transistor to conduct charge from a second drain via positioned on a lower half of the bit line lead to ground through a second ground via positioned on a second ground lead having a central longitudinal axis substantially aligned with a lower boundary of the bitcell height. Causing transistor M3 of FIG. 6 to conduct charge from drain via 510 to ground through ground via 520 is an example of act 805.

The disclosure will now be summarized in the following series of example clauses:

Clause 1. A read-only memory, comprising:
a semiconductor substrate including a diffusion region configured to form a drain of a first transistor and a drain of a second transistor;
a metal layer adjacent the diffusion region, the metal layer being configured to include a bit line lead that extends across the diffusion region;
a first drain via positioned within an upper half of the bit line lead, the first drain via being configured to couple from the upper half of the bit line lead to the drain of the first transistor; and
a second drain via positioned within a lower half of the bit line lead, the second drain via being configured to couple from the lower half of the bit line lead to the drain of the second transistor.

Clause 2. The read-only memory of clause 1, wherein the diffusion region is further configured to extend across a width of a first bitcell, the first bitcell having a bitcell height extending from a lower bitcell boundary, and wherein the metal layer is further configured to include a first ground lead having a central longitudinal axis substantially aligned with the lower bitcell boundary.

Clause 3. The read-only memory of clause 2, wherein the diffusion region is further configured to include a shared source of the first transistor and of the second transistor, the read-only memory further comprising:
a first column of local interconnect coupled to the shared source; and
a first ground via configured to couple between the first ground lead and the first column of local interconnect.

Clause 4. The read-only memory of clause 3, wherein the metal layer is further configured to include a second ground lead having a central longitudinal axis substantially aligned with an upper boundary of the bitcell height, the read-only memory further comprising:
a second ground via configured to couple between the second ground lead and the first column of local interconnect.

Clause 5. The read-only memory of clause 3, further comprising:
a second column of local interconnect coupled to the drain of the first transistor, wherein the first drain via is configured to extend between the upper half of the bit line lead and the second column of local interconnect.

Clause 6. The read-only memory of clause 5, further comprising:
a third column of local interconnect coupled to the drain of the second transistor, wherein the second drain via is configured to extend between the lower half of the bit line lead and the third column of local interconnect.

Clause 7. The read-only memory of clause 4, wherein the diffusion region is further configured to extend across a width of a second bitcell and to include within the second bitcell a drain of a third transistor and a drain of a fourth transistor, and wherein the drain of the third transistor and the drain of the fourth transistor are both electrically isolated from bit line lead.

Clause 8. The read-only memory of clause 7, wherein the diffusion region is further configured to extend across a width of a third bitcell and to include with the third bitcell a drain of a fifth transistor and a drain of a sixth transistor, the read-only memory further comprising:
a third drain via positioned with the upper half of the bit line lead, the third drain via being configured to couple from the upper half of the bit line lead to the drain of the fifth transistor.

Clause 9. The read-only memory of clause 8, wherein the drain of the sixth transistor is electrically isolated from the bit line lead.

Clause 10. The read-only memory of clause 8, further comprising:
a fourth drain via positioned with the lower half of the bit line lead, the fourth drain via being configured to couple from the lower half of the bit line lead to the drain of the sixth transistor.

Clause 11. The read-only memory of any of clauses 1-10, wherein the diffusion region is doped n-type, and wherein each first transistor and each second transistor is an n-type metal-oxide-semiconductor (NMOS) transistor.

Clause 12. The read-only memory of any of clauses 1-10, wherein the diffusion region is doped p-type, and wherein each first transistor and each second transistor is a p-type metal-oxide-semiconductor (PMOS) transistor.

Clause 13. The read-only memory of any of clauses 1-12, wherein the first transistor and the second transistor are thick-gate-oxide transistors Clause 14. A read-only memory, comprising:
a plurality of bitcells arranged into a row within a bitcell height, each bitcell in the plurality of bitcells including a first transistor and a second transistor;
a diffusion region configured to extend across the row, the diffusion region being configured for each bitcell in the plurality of bitcells to form a drain of the bitcell's first transistor and to form a drain of the bitcell's second transistor; and a metal layer adjacent the diffusion region, the metal layer being configured to include a bit line lead that extends across the row; wherein each bitcell in a first subset of the plurality of bitcells is configured to include a first drain via positioned on and coupled from a lower half of the bit line lead to the drain of the bitcell's first transistor and to include a second drain via positioned on and coupled from an upper half of the bit line lead to the drain of the bitcell's second transistor and, and wherein each bitcell in a second subset of the plurality of bitcells is configured to electrically isolate both the drain of the bitcell's first transistor and the drain of the bitcell's from the bit line lead.

Clause 15. The read-only memory of clause 14, wherein each bitcell in a third subset of the plurality of bitcells is configured to include a first drain via positioned on and coupled from a lower half of the bit line lead to the drain of the bitcell's first transistor, and wherein the bitcell is configured to electrically isolate the drain of the bitcell's second transistor from the bit line lead.

Clause 16. The read-only memory of clause 15, wherein a fourth bitcell in the plurality of bitcells is configured to include a fourth via coupled between the drain of the fourth bitcell's second transistor and the upper half of the bit line lead, wherein the drain of the fourth bitcell's first transistor is configured to be isolated from the bit line lead.

Clause 17. The read-only memory of clause 14, wherein the metal layer is further configured to include a first ground lead having a central longitudinal axis substantially aligned with an upper boundary of the bitcell height, and wherein each bitcell in the plurality of bitcells includes a first ground via coupled between the first ground lead and a shared source of the bitcell's first transistor and second transistor.

Clause 18. The read-only memory of clause 17, wherein the metal layer is further configured to include a second ground lead having a central longitudinal axis substantially aligned with a lower boundary of the bitcell height, and wherein each bitcell in the plurality of bitcells includes a second ground via coupled between the second ground lead and the shared source of the bitcell's first transistor and second transistor.

Clause 19. A method of operating a read-only memory, comprising;

asserting a voltage of a first word line coupled to a gate of a first transistor arranged in a row within a bitcell height with a second transistor to cause the first transistor to conduct charge from a first drain via positioned on an upper half of a bit line lead to ground through a first ground via positioned on a first ground lead having a central longitudinal axis aligned with an upper boundary of the bitcell height and through a second ground via positioned on a second ground lead having a central longitudinal axis aligned with a lower boundary of the bitcell height; and asserting a voltage of a second word line coupled to a gate of the second transistor to cause the second transistor to conduct charge from a second drain via positioned on a lower half of the bit line lead to ground through the first ground via and through the second ground via.

Clause 20. The method of clause 19, further comprising: detecting a first discharge of the bit line lead responsive to the asserting the voltage of the first word line to read a first bit from a drain programming of the first transistor.

Clause 21. The method of clause 20, further comprising: detecting a second discharge of the bit line lead responsive to the asserting the voltage of the second word line to read a second bit from a drain programming of the second transistor.

Clause 22. A read-only memory, comprising:
a diffusion region configured to extend from a first side of a bitcell to a second side of the bitcell;
a first dummy gate aligned with the first side of the bitcell;
a second dummy gate aligned with the second side of the bitcell;
a gate of a first transistor adjacent the first dummy gate and configured to extend from a lower boundary of the bitcell and across the diffusion region to an upper boundary of the bitcell;
a gate of a second transistor arranged between the gate of the first transistor and the second dummy gate, wherein the diffusion region is further configured to form a drain of the first transistor positioned between the first dummy gate and the gate of the first transistor, a shared source of the first transistor and the second transistor positioned between the gate of the first transistor and the gate of the second transistor, and a drain of the second transistor positioned between the gate of the second transistor and the second dummy gate;
a metal layer adjacent the diffusion region, the metal layer being configured to form a bit line lead having a height, the metal layer being further configured to form a first ground lead having a central longitudinal axis substantially aligned with the upper boundary of the height of the bitcell; and
a first via positioned on a first half of the height of the bit line lead and coupled to the drain of the first transistor, wherein a drain of the second transistor is isolated from bit line lead.

Clause 23. The read-only memory of clause 22, further comprising:
a first ground via coupled between the shared source and the first ground lead.

Clause 24. The read-only memory of clause 23, wherein the metal layer is further configured to form a second ground lead having a central longitudinal axis substantially aligned with the lower boundary of the height of the bitcell, the read-only memory further comprising:
a second ground via coupled between the shared source and the second ground lead.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:
1. A read-only memory, comprising:
a semiconductor substrate including a diffusion region configured to form a drain of a first transistor and a drain of a second transistor;
a metal layer adjacent the diffusion region, the metal layer being configured to include a bit line lead that extends across the diffusion region;
a first drain via positioned within an upper half of the bit line lead, the first drain via being configured to couple from the upper half of the bit line lead to the drain of the first transistor; and a second drain via positioned within a lower half of the bit line lead, the second drain via configured to couple from the lower half of the bit line lead to the drain of the second transistor.

2. The read-only memory of claim 1, wherein the diffusion region is further configured to extend across a width of a first bitcell, the first bitcell having a bitcell height extending from a lower bitcell boundary, and wherein the metal layer is further configured to include a first ground lead having a central longitudinal axis substantially aligned with the lower bitcell boundary.

3. The read-only memory of claim 2, wherein the diffusion region is further configured to include a shared source of the first transistor and of the second transistor, the read-only memory further comprising:
a first column of local interconnect coupled to the shared source; and
a first ground via configured to couple between the first ground lead and the first column of local interconnect.

4. The read-only memory of claim 3, wherein the metal layer is further configured to include a second ground lead having a central longitudinal axis substantially aligned with an upper boundary of the bitcell height, the read-only memory further comprising:
a second ground via configured to couple between the second ground lead and the first column of local interconnect.

5. The read-only memory of claim 3, further comprising:
a second column of local interconnect coupled to the drain of the first transistor, wherein the first drain via is configured to extend between the upper half of the bit line lead and the second column of local interconnect.

6. The read-only memory of claim 5, further comprising:
a third column of local interconnect coupled to the drain of the second transistor, wherein the second drain via is configured to extend between the lower half of the bit line lead and the third column of local interconnect.

7. The read-only memory of claim 4, wherein the diffusion region is further configured to extend across a width of a second bitcell and to include within the second bitcell a drain of a third transistor and a drain of a fourth transistor, and wherein the drain of the third transistor and the drain of the fourth transistor are both electrically isolated from bit line lead.

8. The read-only memory of claim 7, wherein the diffusion region is further configured to extend across a width of a third bitcell and to include with the third bitcell a drain of a fifth transistor and a drain of a sixth transistor, the read-only memory further comprising:
a third drain via positioned with the upper half of the bit line lead, the third drain via being configured to couple from the upper half of the bit line lead to the drain of the fifth transistor.

9. The read-only memory of claim 8, wherein the drain of the sixth transistor is electrically isolated from the bit line lead.

10. The read-only memory of claim 8, further comprising:
a fourth drain via positioned with the lower half of the bit line lead, the fourth drain via being configured to couple from the lower half of the bit line lead to the drain of the sixth transistor.

11. The read-only memory of claim 1, wherein the diffusion region is doped n-type, and wherein each first transistor and each second transistor is an n-type metal-oxide-semiconductor (NMOS) transistor.

12. The read-only memory of claim 1, wherein the diffusion region is doped p-type, and wherein each first transistor and each second transistor is a p-type metal-oxide-semiconductor (PMOS) transistor.

13. The read-only memory of claim 1, wherein the first transistor and the second transistor are thick-gate-oxide transistors.

14. A read-only memory, comprising:
a plurality of bitcells arranged into a row within a bitcell height, each bitcell in the plurality of bitcells including a first transistor and a second transistor;
a diffusion region configured to extend across the row, the diffusion region being configured for each bitcell in the plurality of bitcells to form a drain of the bitcell's first transistor and to form a drain of the bitcell's second transistor; and
a metal layer adjacent the diffusion region, the metal layer being configured to include a bit line lead that extends across the row; wherein each bitcell in a first subset of the plurality of bitcells is configured to include a first drain via positioned on and coupled from a lower half of the bit line lead to the drain of the bitcell's first transistor and to include a second drain via positioned on and coupled from an upper half of the bit line lead to the drain of the bitcell's second transistor and, and wherein each bitcell in a second subset of the plurality of bitcells is configured to electrically isolate both the drain of the bitcell's first transistor and the drain of the bitcell's second transistor from the bit line lead.

15. The read-only memory of claim 14, wherein each bitcell in a third subset of the plurality of bitcells is configured to include a first drain via positioned on and coupled from a lower half of the bit line lead to the drain of the bitcell's first transistor, and wherein the bitcell is configured to electrically isolate the drain of the bitcell's second transistor from the bit line lead.

16. The read-only memory of claim 15, wherein a fourth bitcell in the plurality of bitcells is configured to include a fourth via coupled between the drain of the fourth bitcell's second transistor and the upper half of the bit line lead, wherein the drain of the fourth bitcell's first transistor is configured to be isolated from the bit line lead.

17. The read-only memory of claim 14, wherein the metal layer is further configured to include a first ground lead having a central longitudinal axis substantially aligned with an upper boundary of the bitcell height, and wherein each bitcell in the plurality of bitcells includes a first ground via coupled between the first ground lead and a shared source of the bitcell's first transistor and second transistor.

18. The read-only memory of claim 17, wherein the metal layer is further configured to include a second ground lead having a central longitudinal axis substantially aligned with a lower boundary of the bitcell height, and wherein each bitcell in the plurality of bitcells includes a second ground via coupled between the second ground lead and the shared source of the bitcell's first transistor and second transistor.

19. A method of operating a read-only memory, comprising;
asserting a voltage of a first word line coupled to a gate of a first transistor arranged in a row within a bitcell height with a second transistor to cause the first transistor to conduct charge from a first drain via positioned on an upper half of a bit line lead to ground through a first ground via positioned on a first ground lead having a central longitudinal axis substantially aligned with an upper boundary of the bitcell height; and
asserting a voltage of a second word line coupled to a gate of the second transistor to cause the second transistor to conduct charge from a second drain via positioned on a lower half of the bit line lead to ground through a second ground via positioned on a second ground lead having a central longitudinal axis substantially aligned with a lower boundary of the bitcell height.

20. The method of claim 19, further comprising:
detecting a first discharge of the bit line lead responsive to the asserting the voltage of the first word line to read a first bit from a drain programming of the first transistor.

21. The method of claim 20, further comprising:
detecting a second discharge of the bit line lead responsive to the asserting the voltage of the second word line to read a second bit from a drain programming of the second transistor.

22. A read-only memory, comprising:
a diffusion region configured to extend from a first side of a bitcell to a second side of the bitcell;
a first dummy gate aligned with the first side of the bitcell;
a second dummy gate aligned with the second side of the bitcell;
a gate of a first transistor adjacent the first dummy gate and configured to extend from a lower boundary of the bitcell and across the diffusion region to an upper boundary of the bitcell;
a gate of a second transistor arranged between the gate of the first transistor and the second dummy gate, wherein the diffusion region is further configured to form a drain of the first transistor positioned between the first dummy gate and the gate of the first transistor, a shared source of the first transistor and the second transistor positioned between the gate of the first transistor and the gate of the second transistor, and a drain of the second transistor positioned between the gate of the second transistor and the second dummy gate;
a metal layer adjacent the diffusion region, the metal layer being configured to form a bit line lead having a height, the metal layer being further configured to form a first ground lead having a central longitudinal axis substantially aligned with the upper boundary of the height of the bitcell; and
a first via positioned on a first half of the height of the bit line lead and coupled to the drain of the first transistor, wherein a drain of the second transistor is isolated from bit line lead.

23. The read-only memory of claim 22, further comprising
a first ground via coupled between the shared source and the first ground lead.

24. The read-only memory of claim 23, wherein the metal layer is further configured to form a second ground lead having a central longitudinal axis substantially aligned with the lower boundary of the height of the bitcell, the read-only memory further comprising:
a second ground via coupled between the shared source and the second ground lead.

* * * * *